United States Patent [19]

Banzhaf

[11] 4,197,470

[45] Apr. 8, 1980

[54] TRIGGERABLE FLIP-FLOP

[75] Inventor: Walter H. Banzhaf, Richardson, Tex.

[73] Assignee: Texas Instruments Incorporated, Dallas, Tex.

[21] Appl. No.: 850,525

[22] Filed: Nov. 11, 1977

Related U.S. Application Data

[63] Continuation of Ser. No. 705,502, Jul. 15, 1976, abandoned.

[51] Int. Cl.² ............................................. H03K 3/286
[52] U.S. Cl. ............................... 307/291; 307/272 A;
307/279; 357/92
[58] Field of Search ............... 307/288, 279, 291, 313,
307/289, 272 A; 357/92

[56] References Cited

U.S. PATENT DOCUMENTS 3,993,918  11/1976  Sinclair .................................. 307/291

Primary Examiner—John Zazworsky
Attorney, Agent, or Firm—Mel Sharp; James T. Comfort; N. Rhys Merrett

[57] ABSTRACT

A triggerable bipolar flip-flop, such as an I²L flip-flop, is comprised of a master stage, a slave stage, two logically-controlled current sources, and a clock-controlled current sink. The current source and current sink are coupled to the set and reset inputs of the master stage. When the clock signal is at one level, the current sink draws current from the set and reset inputs of the master stage, thereby disabling the master stage. When the clock signal is at a second level, the current sink turns off permitting the current source to enable the master stage. Logic signals control the current sources to selectively transmit current to the set or reset input of the master stage. Toggle, J-K, D, and pseudo D embodiments of the flip-flop may be provided.

6 Claims, 10 Drawing Figures

TRIGGERABLE FLIP-FLOP

This is a continuation of application Ser. No. 705,502, filed July 15, 1976, now abandoned.

BACKGROUND OF THE INVENTION

This invention relates to semiconductor memory devices and, more particularly, to an improved flip-flop employing bipolar technology.

Flip-flops are extensively used in digital equipment. In a digital computer for example, flip-flops are commonly combined in complex irregular fashions to generate control logic signals, and are combined in simple regular fashion to form registers.

Over the past few years, the tendency of digital equipment has been to operate faster and to take less physical space. Since bipolar flip-flops are so extensively used in digital equipment, it is very desirable to make them faster and smaller.

In the past, it has been possible to fabricate many conventional flip-flops on a semiconductor chip, but they still exhibited some undesirable size and/or speed characteristics. For example, a conventional I$^2$L master-slave flip-flop operates quickly but requires over 30 square mils of surface area. Such flip-flops may simply be impractical to use when the particular digital equipment requires a large number of flip-flops but is restricted in size. For example, a 16-bit microprocessor chip requires that hundreds of flip-flops plus thousands of gates and thousands of ROM bits be fabricated on a square silicon chip being no larger than 300 mils on a side.

Modifications to the conventional I$^2$L master-slave flip-flops have been proposed which utilize less area; but some of these proposed flip-flops operate slower, and others are highly sensitive to internal feedback currents from the slave stage and thus are subject to false triggering.

Therefore, one object of the invention is to provide an improved triggerable flip-flop.

It is another objective of the invention to provide an improved flip-flop with relatively fast operating characteristics.

A further object of the invention is to provide an integrated flip-flop which requires a reduced surface area.

BRIEF SUMMARY OF THE INVENTION

These and other objects are accomplished in accordance with the invention in which a first pair of cross-coupled I$^2$L transistors in a master stage of a triggerable flip-flop are selectively turned on and off by a clock controlled current sink and logically-controlled current sources. When the clock signal is at a "1" voltage level, the current sink turns off both transistors of the master stage by drawing current supplied by the logically-controlled current sources away from the master stage set and reset nodes. When the clock signal is at a logic "0" voltage level, the current sink permits current supplied by the logically-controlled current sources to flow into the master stage and turn on one transistor of the first cross-coupled pair. A slave stage then responds to the state of the master stage. Toggle, J-K and D embodiments of the flip-flop are provided by altering the configuration of the logically-controlled current sources.

BRIEF DESCRIPTION OF THE DRAWINGS

The novel features believed characteristic of the invention are set forth in the appended claims; the invention itself, however, as well as other features and advantages thereof, will best be understood by reference to the following detailed description of particular embodiments, read in conjunction with the accompanying drawings, wherein:

DETAILED DESCRIPTION OF PREFERRED EMBODIMENTS

Figure 1:
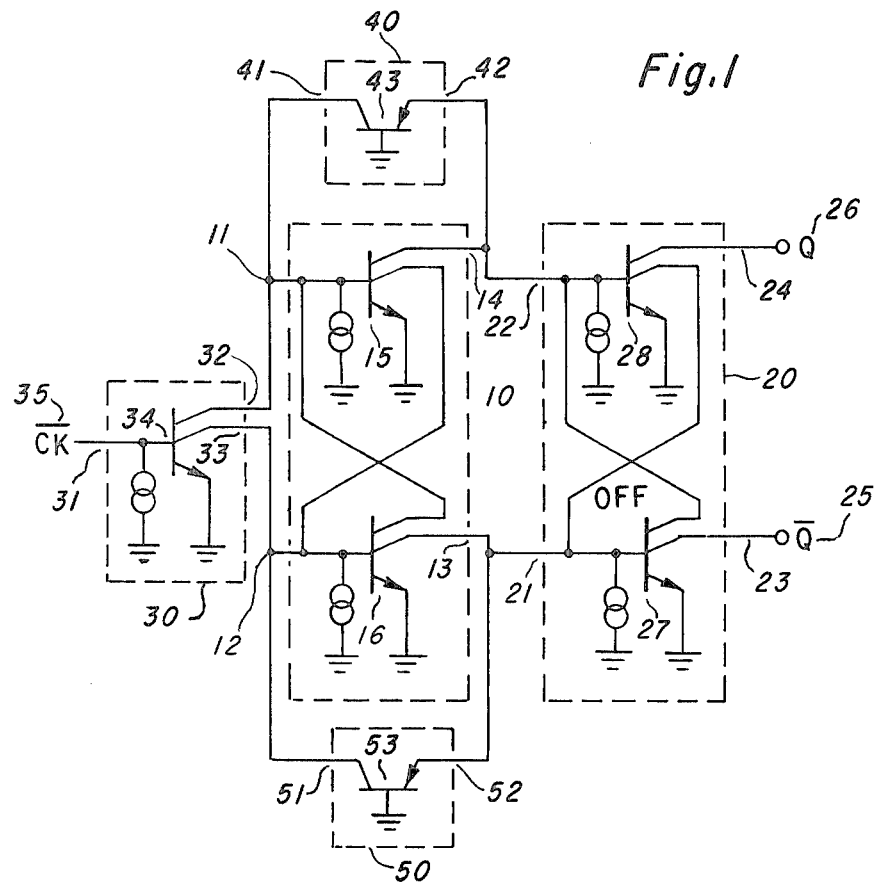
FIG. 1 is a circuit diagram of a toggle flip-flop embodiment of the invention.

Referring to FIG. 1, a toggle flip-flop embodiment of the invention is illustrated. The toggle flip-flop is comprised primarily of a master stage 10, a slave stage 20, current sinking means 30, set-current source 40, and reset-current source 50. It has a clock node 31, a Q output node 24, and a $\overline{Q}$ output node 23. A Q signal 26 and a $\overline{Q}$ signal 25 are generated on Q output node 24 and $\overline{Q}$ output node 23 respectively. When a ck signal 35 is applied to clock node 31, each transition from a "1" voltage level to a "0" voltage level causes Q signal 26 and $\overline{Q}$ signal 25 to change state.

Figure 2:
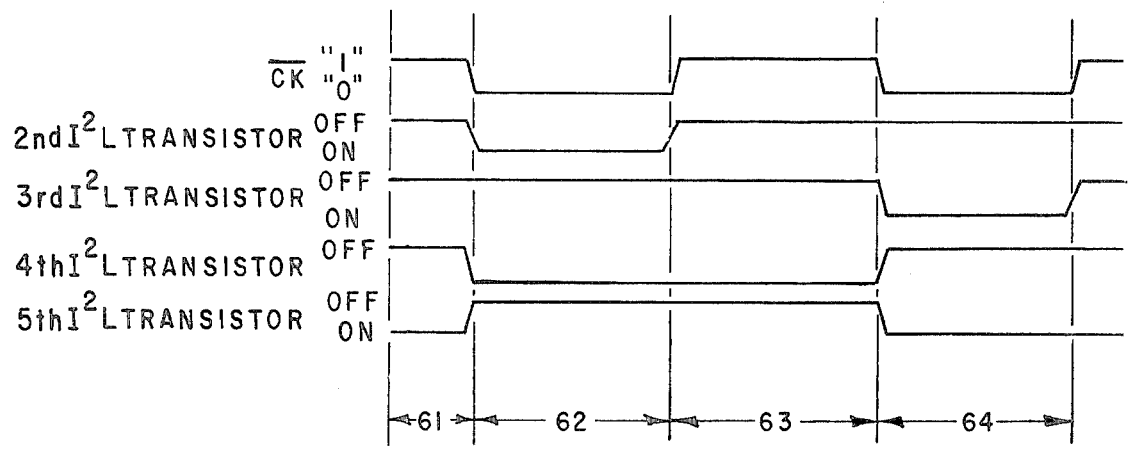
FIG. 2 is a timing diagram illustrating the voltage of the $\overline{ck}$ signal and the state of various transistors of the circuit in FIG. 1 as a function of time.

The electrical operation of this first embodiment is best understood by referring to FIG. 1 in conjunction with FIG. 2. During a first time interval 61, $\overline{ck}$ signal 35 is at a "1" voltage level. Clock node 31 connects to the base of an NPN I$^2$L transistor 34 within current sinking means 30; and the "1" voltage level of $\overline{ck}$ signal 35 permits transistor 34 to turn on. Transistor 34 then sinks current into a first sink node 32 and a second sink node 33 of current sinking means 30.

First sink node 32 is coupled to a master set node 11 of master stage 10, and to a set-current node 41 of set-current source 40. Therefore, when $\overline{ck}$ signal 35 is at a "1" voltage level, first sink node 32 sinks current away from nodes 11 and 41.

Similarly, second sink node 33 is coupled to a master reset node 12 of master stage 10, and to a reset current node 51 of reset current source 50. Therefore, when $\overline{ck}$ signal 35 is at a "1" voltage level, second sink node 33 sinks current away from nodes 12 and 51.

Master stage 10 is comprised of a first pair of cross-coupled NPN I$^2$L transistors 15 and 16. Master set node 11 is coupled to the base of transistor 15, and master reset node 12 is coupled to the base of transistor 16. When $\overline{ck}$ signal 35 is at a "1" voltage level, current sinking means 30 sinks current away from node 11 and node 12; therefore, both transistors 15 and 16 turn off; and therefore, master Q output node 13 and master $\overline{Q}$ output node 14 of master stage 10 are then at infinite impedance to provide an open circuit condition.

Master Q output node 13 is coupled to a slave set node 21 of slave stage 20 and to a reset-current control node 52. Similarly, master $\overline{Q}$ output node 14 connects to a slave reset node 22 of slave stage 20 and to a set-current control node 42. When ck signal 35 is at a "1" voltage level, the voltage on nodes 21, 52, 22 and 42 are not affected by master stage 10 because nodes 13 and 14 are in an open circuit condition as discussed above.

Slave stage 20 is comprised of a second pair of cross-coupled NPN I$^2$L transistors 27 and 28. Slave set node 21 is coupled to the base of transistor 27. Therefore, when ck signal 35 is at a "1" voltage level, the state of transistors 27 and 28 are not affected by master stage 10 because master Q output node 13 and master $\overline{Q}$ output node 14 are in an open circuit condition.

For the purpose of further explaining how the toggle flip-flop embodiment operates, assume that transistor 28 is turned on. Therefore, due to cross-coupling, transistor 27 is off. Also, since transistor 28 is on, a relatively low voltage is on reset-current control node 52 which connects to the emitter of a PNP transistor 53 within reset-current source 50. Therefore, transistor 53 turns off, and reset-current source 50 supplies no current to reset-current node 51.

On the other hand, since transistor 27 is off, a relatively high voltage is on set-current control node 42, which connects to the emitter of a second PNP transistor 43 within set-current source 40. Therefore, transistor 43 turns on, and set-current source 40 supplies current to set-current node 41.

Current supplied by set-current source 40 will subsequently control the state of master stage 10. However, an important aspect of the invention is that when $\overline{ck}$ signal 35 is at a "1" voltage level, current from set-current source 40 or from reset-current source 50 is positively sinked away from master set node 11 and master reset node 12 by current sinking means 30, and therefore, master stage 10 has no tendency to erroneously turn on.

Another important aspect of the invention is that a triggerable flip-flop utilizing logically-controlled current sources to control the master stage requires less surface area to implement than a conventional flip-flop made entirely of logic gates. This is because parasitic transistors are used to implement current sources, whereas, isolated transistors are used to implement logic gates. For example, the collector of PNP transistor 53 and the base of NPN transistor 16, which are electrically connected, both require a P-doped region, and therefore, can share the same region. Similarly, P-doped regions can also be shared by the emitter of transistor 53 and the base of transistor 27, the collector of transistor 43 and the base of transistor 15, and the emitter of transistor 43 and the base of transistor 28.

At the beginning of a second time interval 62, $\overline{ck}$ signal 35 switches to a "0" voltage level, which turns off transistor 34, and therefore, current is no longer sinked away from master set node 11 and master reset node 12. Thus, both transistors 15 and 16 of master stage 10 begin to turn on. But transistor 15 turns on first because set-current source 40 is on and reset-current source 50 is off. Therefore, due to cross coupling, transistor 16 remains turned off.

When transistor 15 turns on, transistor 28 turns off, and transistor 27 turns on. Therefore, set-current source 40 stops supplying current, and reset-current source 50 starts supplying current. But, the state of master stage 10 will not be affected by this change in current so long as the injection current times the gain h$_{fe}$ of transistor 15 is greater than the injection current of transistor 16 plus the current supplied by reset-current source 50.

At the beginning of a third time interval 63, $\overline{ck}$ signal switches to a "1" voltage level. In response, current sinking means 30 sinks current away from master-set node 11 and master-reset node 12, both transistors 15 and 16 of master stage 10 turn off, and the state of the slave stage 20 remains unchanged.

At the beginning of a fourth time interval 64, $\overline{ck}$ signal 35 switches to a "0" voltage level. In response, current sinking means 30 stops sinking current, and both transistors 15 and 16 of master stage 10 begin to turn on. But, transistor 16 will turn on first because reset-current source 50 is supplying current while the set-current source 40 is not supplying current. Therefore, due to cross-coupling, transistor 51 remains off, transistor 28 turns on, and transistor 27 turns off.

At the end of a fourth time interval 64, $\overline{ck}$ signal 35 switches to a "1" voltage level, and the flip-flop enters the same state that existed during first time interval 61.

Figures 3, 4:
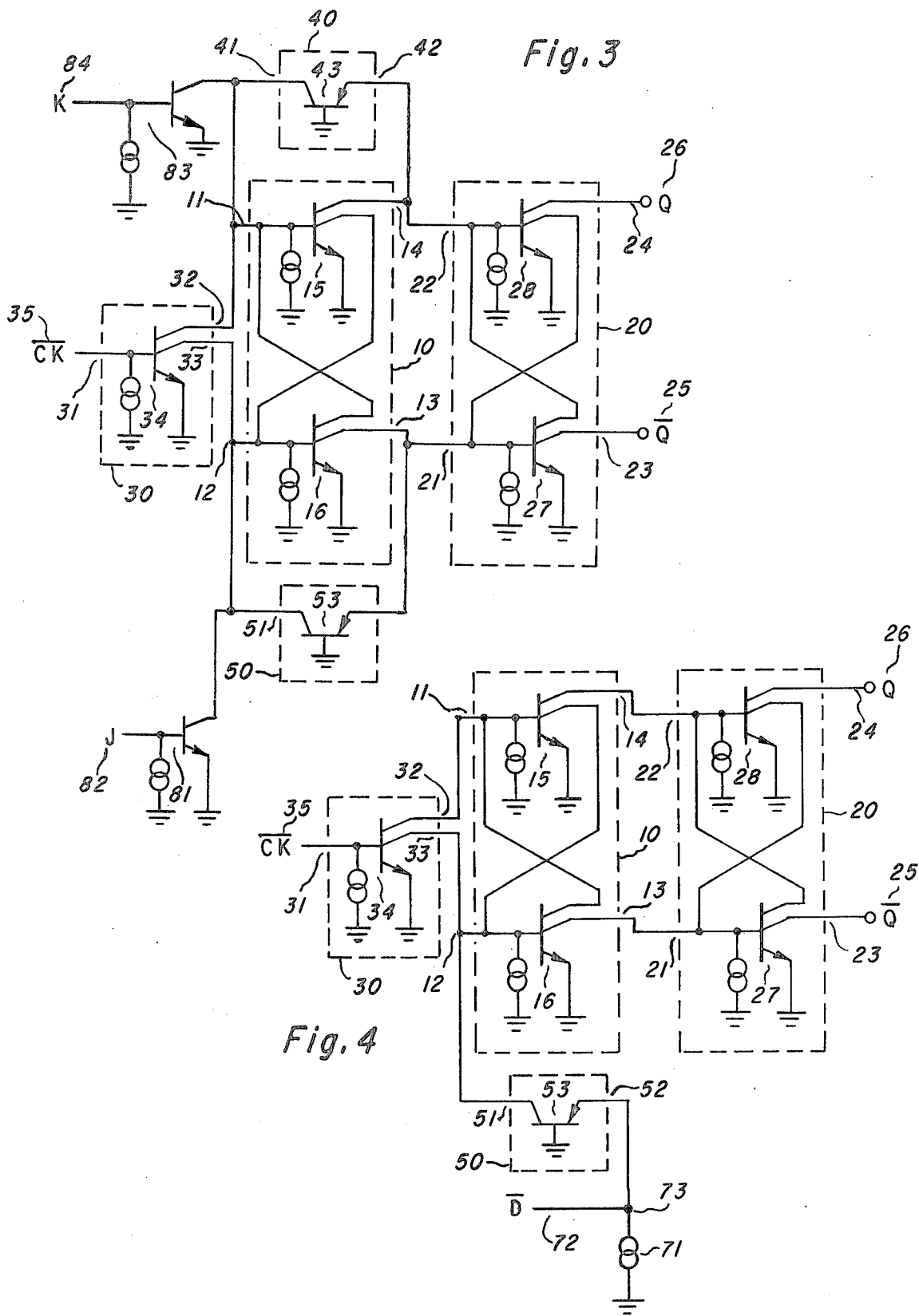
FIG. 3 is a circuit diagram of a J-K flip-flop embodiment of the invention.
FIG. 4 is a circuit diagram of a D flip-flop embodiment of the invention.

Referring to FIG. 3, a second embodiment of the invention is illustrated. The embodiment includes the components and interconnections of the first embodiment, and further, a sixth NPN I$^2$L transistor 81 responsive to a J signal 82, and a seventh NPN I$^2$L transistor 83 responsive to a K signal 84. The resultant flip-flop behaves logically as a J-K flip-flop. When J signal 82 is at a "1" voltage level, transistor 81 turns on and sinks current away from master reset node 12 so master stage 10 cannot reset. Similarly, when K signal 84 is at a "1" logic level, transistor 83 turns on and sinks current away from master set node 11 so master stage 10 cannot set. A logic "0" voltage level on J signal 82 and K signal 84 turn off transistors 81 and 83 and the flip-flop then toggles as the first embodiment.

Referring to FIG. 4, a third embodiment of the invention is illustrated. It logically behaves as a D flip-flop. All components and interconnections are similar to the first embodiment except (1) reset-current node 52 connects only to an injection current source 71 which has a $\overline{D}$ signal 72 applied to its output node 72, (2) set-current source 40 is eliminated, and (3) the injection current of transistor 16 is smaller than the injection current of transistor 15.

When $\overline{ck}$ signal 35 is at a "1" voltage level, current sinking means 30 sinks current away from master stage 10, and therefore, slave stage 20 is not responsive to the voltage level of $\overline{D}$ signal 72. When the $\overline{ck}$ signal 35 goes from a "1" to a "0" voltage level, both transistors 15 and 16 of master stage 10 begin to turn on; and this race is decided by the voltage level of $\overline{D}$ signal 72.

A "1" voltage level of $\overline{D}$ signal 72 permits current supplied by current source 71 to flow into reset-current control node 52. Thus, transistor 53 turns on and supplies current to master reset node 12. The sum of this current plus the injection current of transistor 16 is greater than the injection current of transistor 15. Therefore, transistor 16 turns on and transistor 15 remains off.

A "0" voltage level of $\overline{D}$ signal 72 sinks current supplied by current source 71 away from reset current control node 52. Thus, transistor 53 turns off and supplies no current to master reset node 12. The injection current of transistor 15 is greater than the injection current of transistor 16, therefore, transistor 15 turns on and transistor 16 remains off. Slave stage 20 then responds to master stage 10 as previously described.

Figure 5:
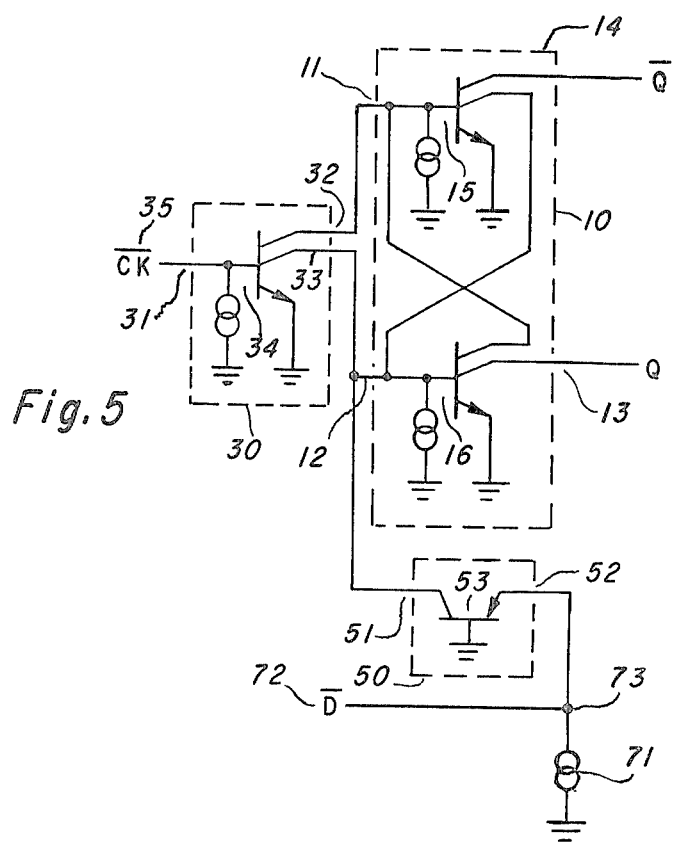
FIG. 5 is a circuit diagram of a pseudo D flip-flop embodiment of the invention.

Referring to FIG. 5, a fourth embodiment of the invention is illustrated; it is similar to the third embodiment except that slave stage 20 is eliminated, and output signals Q and $\overline{Q}$ are formed at master Q output node 13 and master $\overline{Q}$ output node 14 respectively.

The embodiment operates in a similar manner to the operation of the third embodiment except that both output signals have a high impedance level when $\overline{ck}$ signal 35 is at a "1" voltage level.

Figure 6:
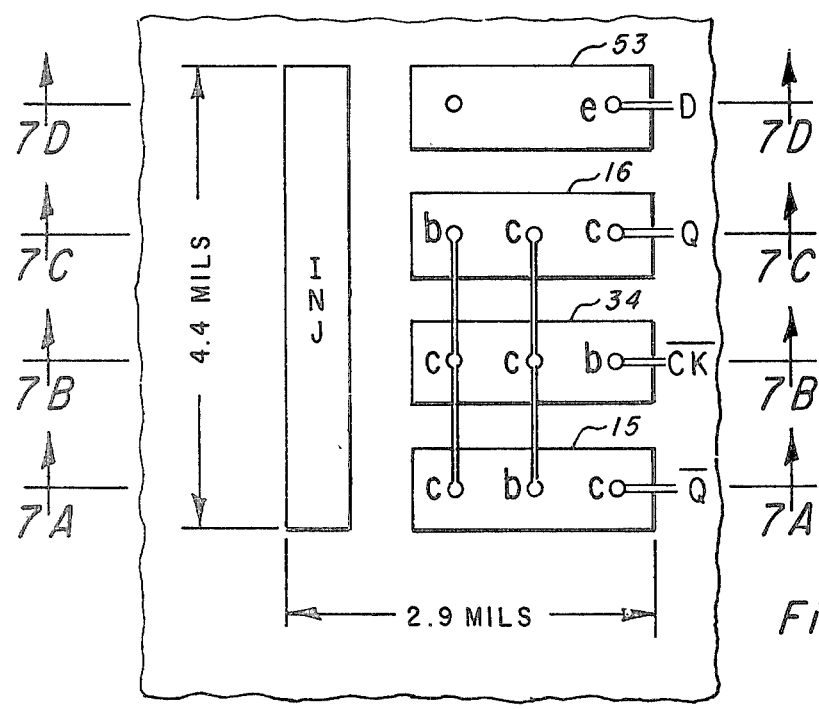
FIG. 6 is a plane view, greatly enlarged, of a physical layout of the circuit of FIG. 5.

An additional feature of this embodiment is that is uses less components and less physical space than any of the previously described embodiments. Referring to FIG. 6, a physical layout of the circuit in FIG. 5 is illustrated. This particular layout occupied only 12.76 square mils of surface area.

Figure 7A:
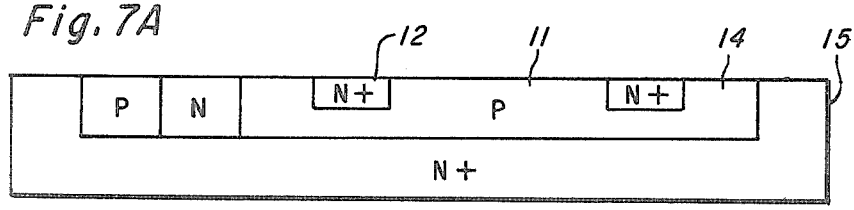
FIGS. 7a–7d are cross-sectional views, greatly enlarged, of the physical layout of the circuit of FIG. 5.
Figure 7B:
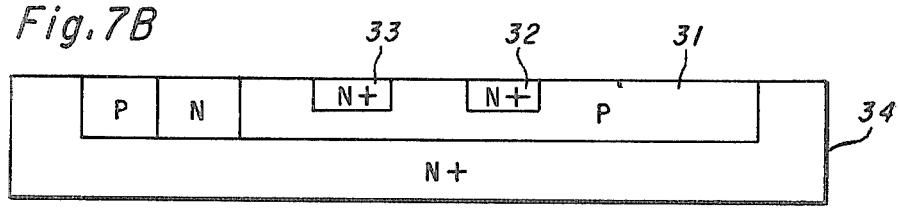
Figure 7C:
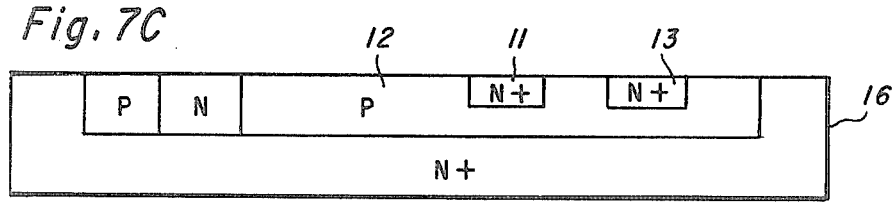
Figure 7D:
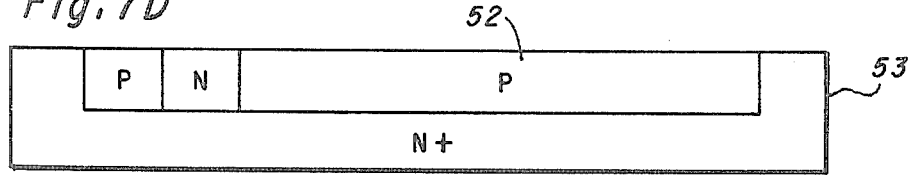

Referring to FIGS. 7a–7d, greatly enlarged cross-sectional views taken through the sections indicated in FIG. 6 are illustrated. FIG. 7a, for example, illustrates the cross-section of transistor 15 and its associated injection current source. Reference numerals labeling the various regions in FIGS. 7a–7d are correlated with the reference numerals of FIGS. 5 and 6. For example, master set node 11 is comprised of a relatively large P-type region having two relatively small N+ type regions, 12 and 14, respectively, formed therein; regions 12 and 14 form the two collectors of transistor 15.

The flip-flops above described may be utilized alone or may be used in combination to form shift registers, counters, and the like as is well known in the art.

Various embodiments of the invention have now been described in detail. Since it is obvious that many changes and modifications can be made in the above details without departing from the nature and spirit of the invention, it is understood that the invention is not to be limited to said details except as set forth in the appended claims.

What is claimed is:

1. A single stage triggerable flip-flop comprising:
   (a) a master stage comprising a single pair of cross-coupled I²L vertical transistors, one vertical transistor of said single pair having a collector forming a Q output node, and the other transistor of said single pair having a collector forming a $\overline{Q}$ output node, each of said vertical transistors having a base connected to an I²L lateral transistor injection current source means;
   (b) current sinking means coupled directly to the base of each transistor of said single pair, means for applying clocking pulses to said current sinking means for sinking current from both transistors in response to one state of said clocking pulses; and
   (c) additional logically-controllable current source means including injection current source means having an output coupled to a $\overline{D}$ signal node for generating thereon a constant injection current, and transistor means switchable in response to one state of a $\overline{D}$ signal for ohmically connecting said $\overline{D}$ signal node to the base of one I²L transistor of said cross-coupled pair.

2. A flip-flop according to claim 1 wherein said I²L vertical transistors of said single pair have injection current source means of unequal size.

3. A triggerable flip-flop comprising:
   (a) a master stage comprising a first pair of cross-coupled I²L vertical transistors, one transistor of said first pair having a collector forming a master Q node, the other transistor of said first pair having a collector forming a master $\overline{Q}$ node, each of said vertical transistors having a base connected to an I²L lateral transistor injection current source means;
   (b) a slave stage comprising a second pair of cross-coupled I²L vertical transistors, one transistor of said second pair having a collector forming a slave $\overline{Q}$ node and having a base coupled to said master Q node, the other transistor of said second pair having a collector forming a slave Q node and having a base coupled to said master $\overline{Q}$ node;
   (c) current sinking means coupled directly to the base of each transistor of said first pair, means for applying clocking pulses to said current sinking means for sinking current from both transistors in response to one state of said clocking pulses; and
   (d) additional logically-controllable injection current source means switchable between on and off conditions by logic signals external of said flip-flop different from said clocking pulses, said additional current source means having an output coupled directly to the base of at least one of the transistors of said first pair for supplying base current thereto in response to said logic signals.

4. A triggerable flip-flop comprising:
   (a) a master stage comprising a first pair of cross-coupled I²L vertical transistors, one transistor of said first pair having a collector forming a master Q node, the other transistor of said first pair having a collector forming a master $\overline{Q}$ node, each of said vertical transistors having a base connected to an I²L lateral transistor injection current source means;
   (b) a slave stage comprising a second pair of cross-coupled I²L vertical transistors, one transistor of said second pair having a collector forming a slave $\overline{Q}$ node and having a base coupled to said master Q node, the other transistor of said second pair having a collector forming a slave Q node and having a base coupled to said master $\overline{Q}$ node, each of said vertical transistors having a base connected to an I²L lateral transistor injection current source means;
   (c) current sinking means coupled directly to the base of each vertical transistor of said first pair, means for applying clocking pulses to said current sinking means for sinking current from both transistors in response to one state of said clocking pulses; and
   (d) additional logically-controllable injection current source means including a fixed injection current source having an output coupled to a $\overline{D}$ signal node for generating thereon a constant injection current, and transistor means switchable in response to one state of a $\overline{D}$ signal for ohmetically connecting said $\overline{D}$ signal node to the base of one of the cross-coupled I²L transistors of said first pair.

5. A triggerable flip-flop comprosing:
   (a) a master stage comprising a first pair of cross-coupled I²L vertical transistors, one transistor of said first pair having a collector forming a master Q node, the other transistor of said first pair having a collector forming a master $\overline{Q}$ node, each of said vertical transistors having a base connected to an I²L lateral transistor injection current source means;
   (b) a slave stage comprising a second pair of cross-coupled I²L vertical transistors, one transistor of said second pair having a collector forming a slave $\overline{Q}$ node and having a base coupled to said master Q node, the other transistor of said second pair having a collector forming a slave Q node and having a base coupled to said master $\overline{Q}$ node, each of said vertical transistors having a base connected to an I²L lateral transistor injection current source means;

(c) current sinking means coupled directly to the base of each transistor of said first pair, means for applying clocking pulses to said current sinking means for sinking current from both transistors in response to one state of said clocking pulses; and (d) an I²L vertical transistor having a base connected to a fixed injection current source forming a J-input node and having a collector coupled to the base of said one transistor of said first pair, and a further I²L vertical transistor having a base connected to a fixed injection current source forming a K-input node and having a collector coupled to the base of said other transistor of said first pair.

6. A flip-flop according to claim 5 further including transistor means for ohmically connecting said master Q node to the base of said one transistor of said first pair in response to said other transistor of said second pair turning off, and for ohmically connecting said master $\overline{Q}$ node to the base of said other transistor of said first pair in response to said one transistor of said second pair turning off.

* * * * *